(12) United States Patent
Hill et al.

(10) Patent No.: US 6,919,590 B2
(45) Date of Patent: Jul. 19, 2005

(54) HETEROJUNCTION BIPOLAR TRANSISTOR WITH MONOLITHICALLY INTEGRATED JUNCTION FIELD EFFECT TRANSISTOR AND METHOD OF MANUFACTURING SAME

(75) Inventors: Darrell Hill, Tempe, AZ (US); Mariam G. Sadaka, Austin, TX (US); Marcus Ray, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/651,544

(22) Filed: Aug. 29, 2003

(65) Prior Publication Data

US 2005/0045911 A1 Mar. 3, 2005

(51) Int. Cl.[7] .......................................... H01L 31/0328
(52) U.S. Cl. ...................... 257/192; 257/197; 438/235; 438/285
(58) Field of Search .............................. 257/192, 194, 257/195, 196, 197, 198, 199, 200, 201; 438/91, 199, 285, 590, 235, 309, 312, 317, 380

(56) References Cited

U.S. PATENT DOCUMENTS

| 5,068,756 A | 11/1991 | Morris et al. |
|---|---|---|
| 5,077,231 A | 12/1991 | Plumton et al. |
| 5,097,312 A | 3/1992 | Bayraktaroglu |
| 5,223,449 A | 6/1993 | Morris et al. |
| 5,243,207 A | 9/1993 | Plumton et al. |
| 5,250,826 A | * 10/1993 | Chang et al. |
| 5,324,671 A | 6/1994 | Bayraktaroglu |
| 5,391,504 A | 2/1995 | Hill et al. |
| 6,063,655 A | * 5/2000 | Shealy et al. |
| 6,465,289 B1 | 10/2002 | Streit et al. |

* cited by examiner

Primary Examiner—Nathan J. Flynn
Assistant Examiner—Kevin Quinto
(74) Attorney, Agent, or Firm—Bryan Cave LLP

(57) ABSTRACT

A semiconductor component includes: a semiconductor substrate (110); an epitaxial semiconductor layer (120) above the semiconductor substrate; a bipolar transistor (770, 870) in the epitaxial semiconductor layer; and a field effect transistor (780, 880) in the epitaxial semiconductor layer. A portion of the epitaxial semiconductor layer forms a base of the bipolar transistor and a gate of the field effect transistor, and the portion of the epitaxial semiconductor layer has a substantially uniform doping concentration. In the same or another embodiment, a different portion of the epitaxial semiconductor layer forms an emitter of the bipolar transistor and a channel of the field effect transistor, and the different portion of the epitaxial semiconductor layer has a substantially uniform doping concentration that can be the same as or different from the substantially uniform doping concentration of the portion of the epitaxial semiconductor layer.

38 Claims, 5 Drawing Sheets

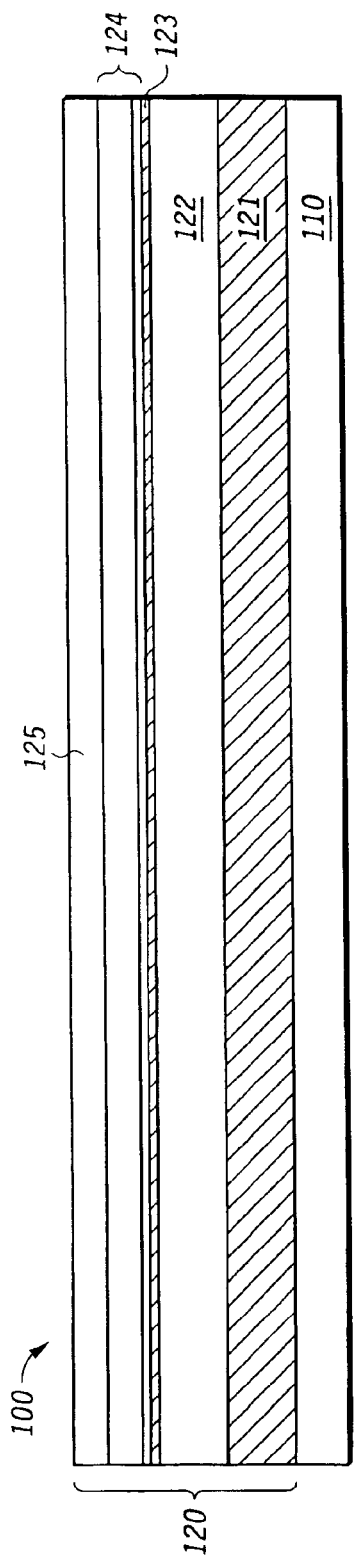
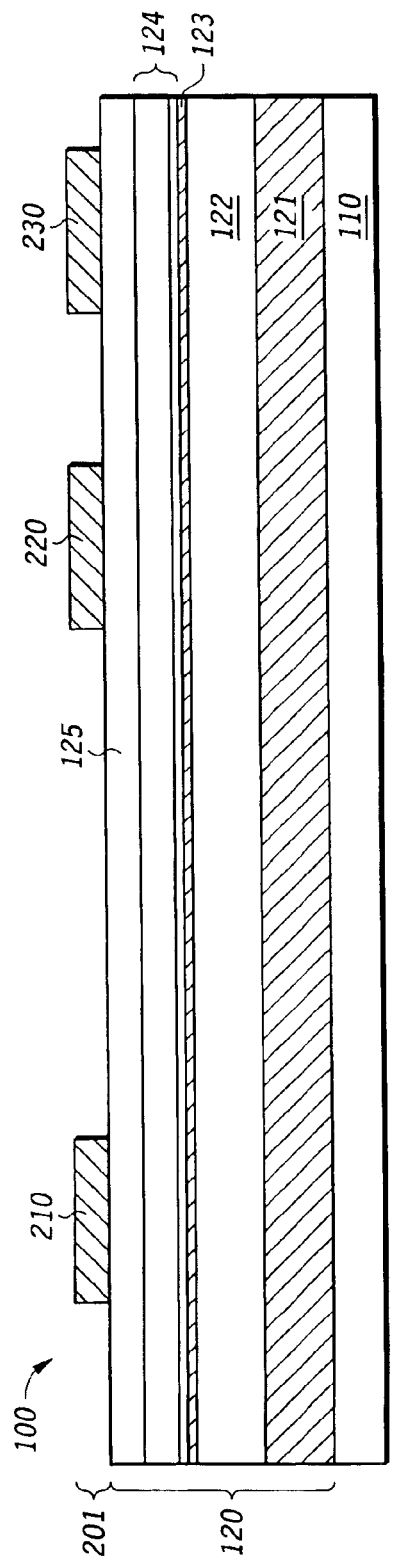

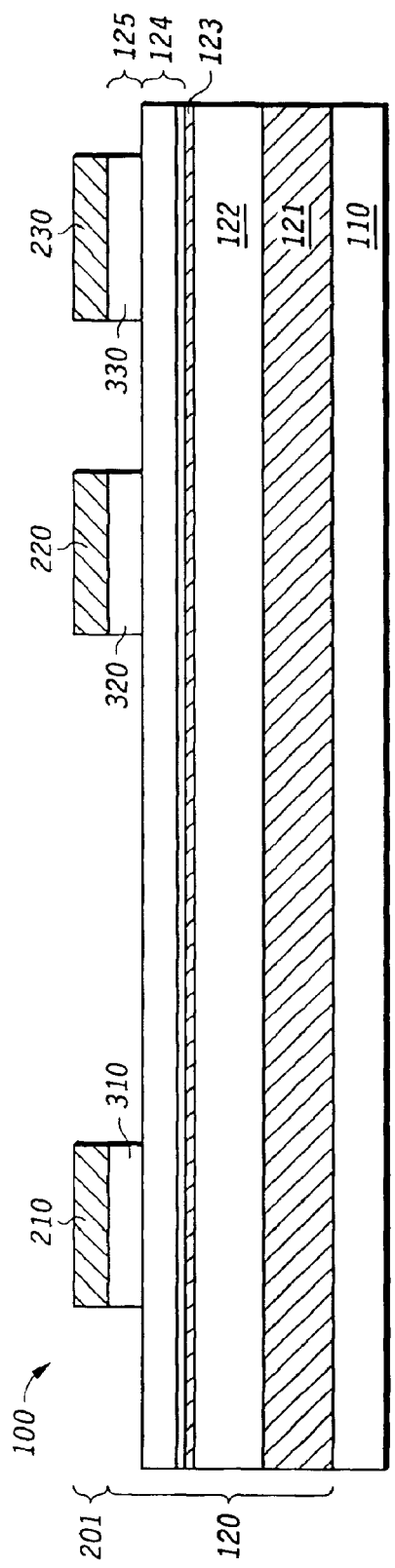
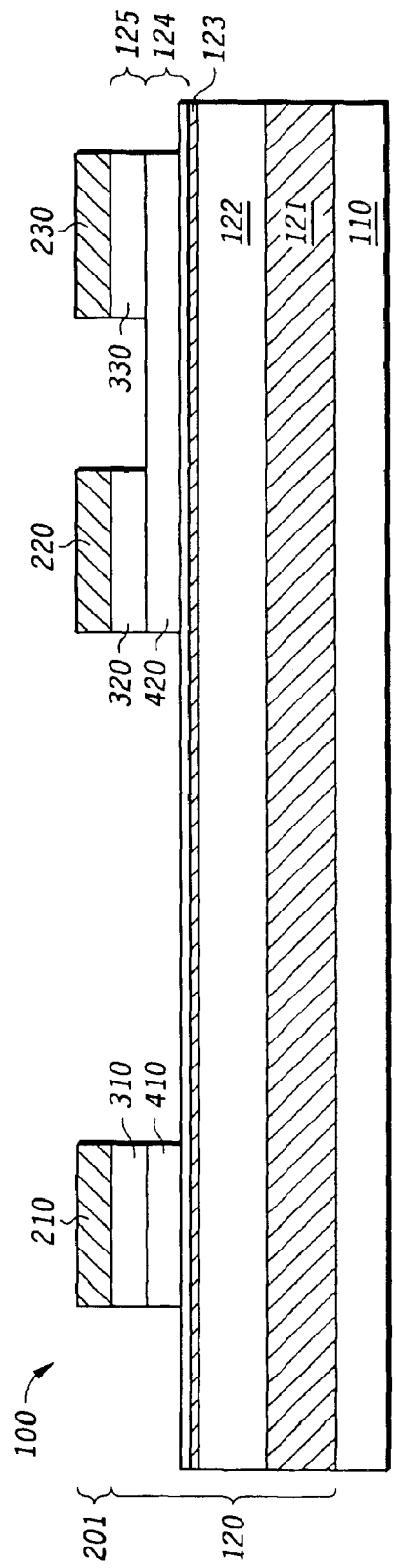

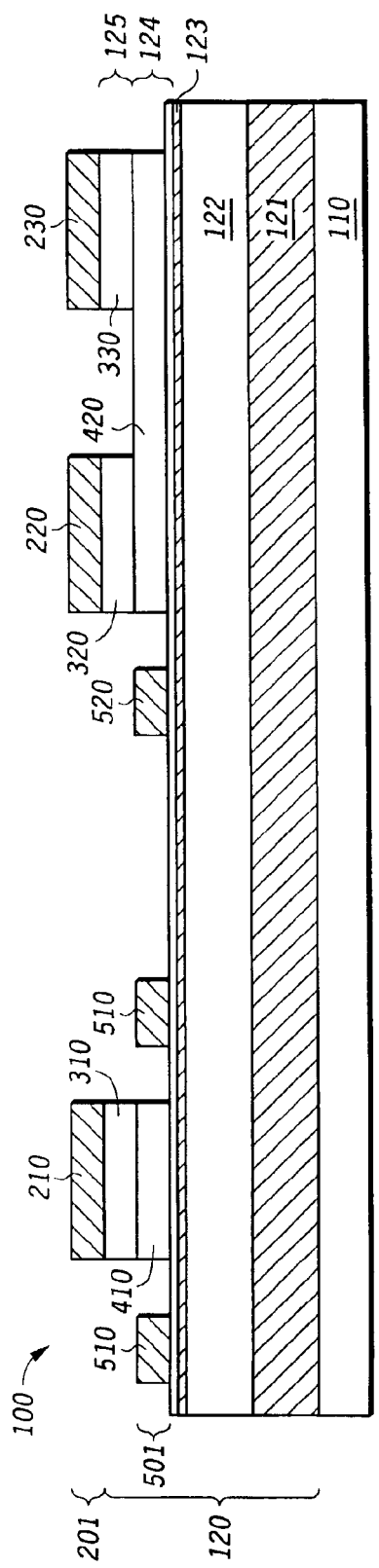
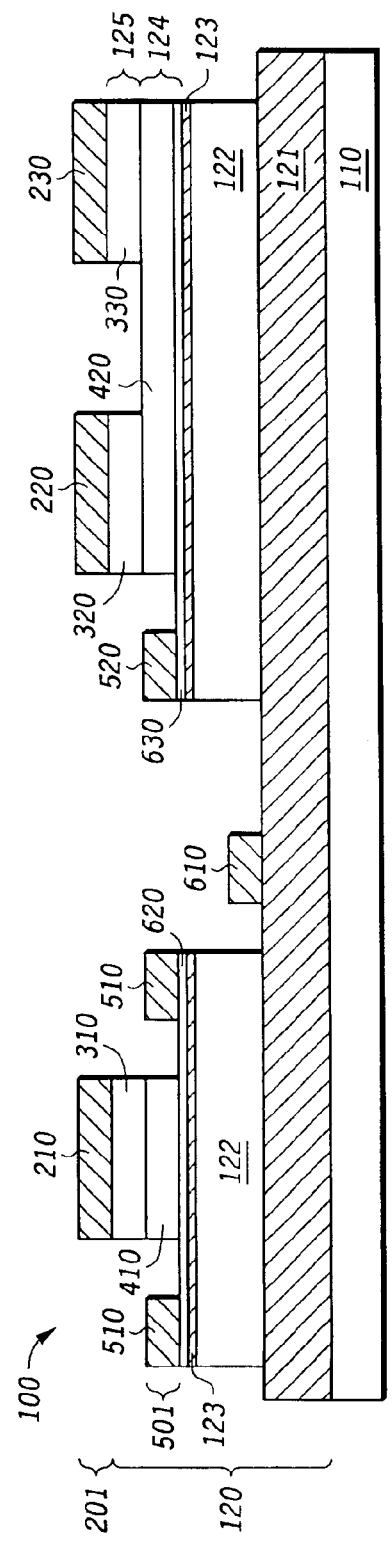
FIG. 5
FIG. 6

# HETEROJUNCTION BIPOLAR TRANSISTOR WITH MONOLITHICALLY INTEGRATED JUNCTION FIELD EFFECT TRANSISTOR AND METHOD OF MANUFACTURING SAME

FIELD OF THE INVENTION

This invention relates generally to semiconductor components, and relates more particularly to transistor integration in semiconductor components.

BACKGROUND OF THE INVENTION

The most commonly used bias circuits for bipolar transistors, such as current mirrors for temperature compensation, require two or more bipolar transistors in series. At very low operating voltages, the voltage drop across two emitter-base junctions of the two bipolar transistors in series may be large enough relative to the available voltage supply that such bias circuits become inoperable. The excessive voltage drop problem may be overcome by coupling a bipolar transistor in series with a field effect transistor, referred to herein as a low-control-voltage transistor, having a control voltage less than the emitter-base turn-on voltage of the bipolar transistor. However, none of the existing techniques for accomplishing such integration are cost-effective or practical for III–V semiconductors such as gallium arsenide (GaAs). A majority of the existing techniques require at least two distinct epitaxial growth steps with intervening wafer processing, making them prohibitively expensive for cost-sensitive applications. Furthermore, ion implantation is not practical for forming reliable p-n junctions in GaAs because gallium and arsenic vacancies and interstitials created by such ion implantation cannot be completely removed by a subsequent anneal, leaving high concentrations of deep-level traps in the GaAs.

Other existing integration techniques require significant wafer processing prior to an epitaxial growth step or steps, or are practical only for p-n-p bipolar transistors and n-channel junction field effect transistors. Such techniques are expensive, poorly reproducible, and incompatible with large segments of the transistor market. Accordingly, a need exists for a semiconductor component that integrates a bipolar transistor with a low-control-voltage transistor, in a package that meets market expectations and needs, and a need also exists for a cost-effective, practical method of manufacturing such a semiconductor component.

BRIEF DESCRIPTION OF THE DRAWINGS

The invention will be better understood from a reading of the following detailed description, taken in conjunction with the accompanying figures in the drawings in which:

FIG. 1 is a cross-sectional view of a portion of a semiconductor component at a particular point in a manufacturing process according to an embodiment of the invention;

FIG. 2 is a cross-sectional view of the semiconductor component of FIG. 1 at a later point in the manufacturing process according to an embodiment of the invention;

FIG. 3 is a cross-sectional view of the semiconductor component of FIG. 2 at a later point in the manufacturing process according to an embodiment of the invention;

FIG. 4 is a cross-sectional view of the semiconductor component of FIG. 3 at a later point in the manufacturing process according to an embodiment of the invention;

FIG. 5 is a cross-sectional view of the semiconductor component of FIG. 4 at a later point in the manufacturing process according to an embodiment of the invention;

FIG. 6 is a cross-sectional view of the semiconductor component of FIG. 5 at a later point in the manufacturing process according to an embodiment of the invention;

Figure 7:
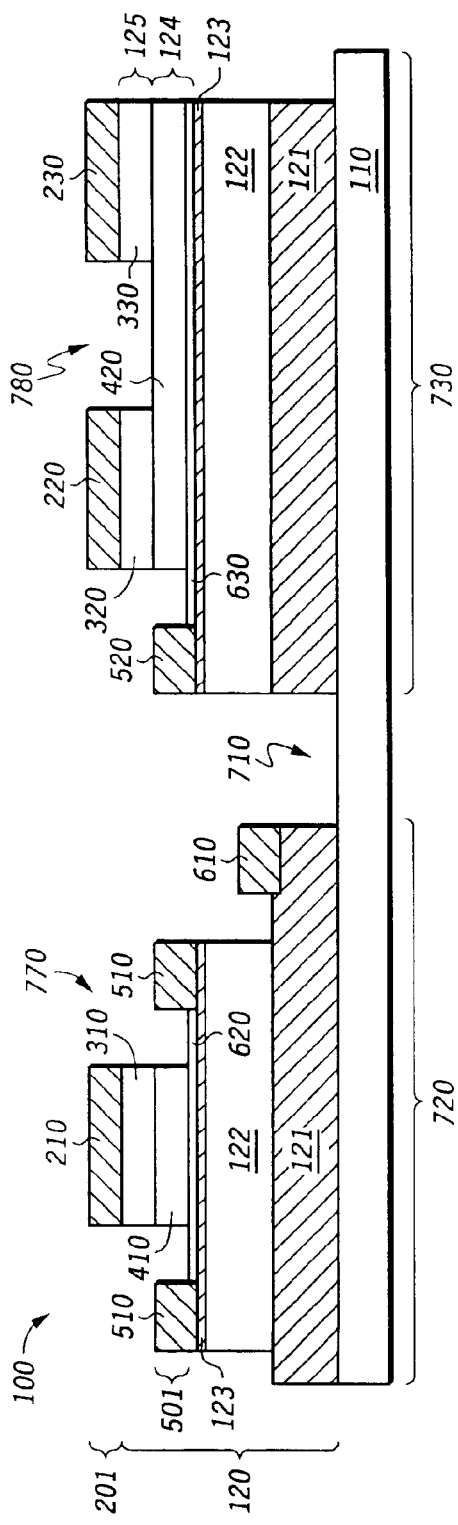
FIG. 7 is a cross-sectional view of the semiconductor component of FIG. 6 at a later point in the manufacturing process according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a semiconductor component comprises: a semiconductor substrate; an epitaxial semiconductor layer above the semiconductor substrate; a bipolar transistor in the epitaxial semiconductor layer; and a field effect transistor in the epitaxial semiconductor layer. A portion of the epitaxial semiconductor layer forms a base of the bipolar transistor and a gate of the field effect transistor, and the portion of the epitaxial semiconductor layer has a first substantially uniform doping concentration. In the same or another embodiment, a different portion of the epitaxial semiconductor layer forms an emitter of the bipolar transistor and a channel of the field effect transistor, and the different portion of the epitaxial semiconductor layer has a substantially uniform doping concentration that can be the same as or different from the substantially uniform doping concentration of the portion of the epitaxial semiconductor layer.

Referring now to the figures, FIG. 1 is a cross-sectional view of a portion of a semiconductor component 100 at a particular point in a manufacturing process according to an embodiment of the invention. Semiconductor component 100 comprises a semiconductor substrate 110 and an epitaxial semiconductor layer 120 above semiconductor substrate 110. As an example, semiconductor substrate 110 can comprise a III–V semiconductor, such as GaAs, indium phosphide (InP), gallium nitride (GaN), and the like. A direction substantially parallel to a surface of semiconductor substrate 110 is a horizontal direction.

Epitaxial semiconductor layer 120 comprises many different portions, including a semiconductor layer 121, a semiconductor layer 122 over semiconductor layer 121, a semiconductor layer 123 over semiconductor layer 122, a semiconductor layer 124 over semiconductor layer 123, and a semiconductor layer 125 over semiconductor layer 124. The formation of semiconductor component 100, including the formation of epitaxial semiconductor layer 120, will be further discussed below. As it is used herein, the phrase "semiconductor layer" can mean a single semiconductor layer or a composite semiconductor layer comprised of two or more semiconductor layers.

Semiconductor layer 123 has a doping concentration greater than or equal to $5\times10^{18}$ atoms per cubic centimeter, and a thickness between approximately 30 and 150 nanometers. In a particular embodiment, semiconductor layer 123 has a doping concentration between approximately $4\times10^{19}$ and $5\times10^{19}$ atoms per cubic centimeter and a thickness between approximately 60 and 100 nanometers. Semiconductor layer 124 has a doping concentration between approximately $5\times10^{16}$ and $5\times10^{18}$ atoms per cubic centimeter, and a thickness between approximately 30 and 300 nanometers. In a particular embodiment, semiconductor layer 124 has a doping concentration between approximately $1\times10^{17}$ and $1\times10^{18}$ atoms per cubic centimeter.

In one embodiment, semiconductor layers 121, 122, 123, 124, and 125 can comprise, respectively, GaAs, GaAs, GaAs, indium gallium phosphide (InGaP), and indium gallium arsenide (InGaAs) overlying GaAs. In another embodiment, semiconductor layer 124 can comprise GaAs overlying InGaP.

FIG. 2 is a cross-sectional view of semiconductor component 100 at a later point in the manufacturing process according to an embodiment of the invention. As illustrated in FIG. 2, semiconductor component 100 further comprises a metal layer 201. Metal layer 201 comprises a metal region 210, a metal region 220, and a metal region 230. The purpose for and fabrication of metal layer 201, including metal regions 210, 220, and 230, will be further explained below. In one embodiment, metal layer 201 can comprise an alloy of titanium, tungsten, and nitrogen.

FIG. 3 is a cross-sectional view of semiconductor component 100 at a later point in the manufacturing process according to an embodiment of the invention. As illustrated in FIG. 3, semiconductor component 100 further comprises an ohmic contact 310, an ohmic contact 320, and an ohmic contact 330. Ohmic contacts 310, 320, and 330 are formed from semiconductor layer 125, in a manner that will be further discussed below. Accordingly, semiconductor layer 125 may be referred to as an ohmic contact region.

FIG. 4 is a cross-sectional view of semiconductor component 100 at a later point in the manufacturing process according to an embodiment of the invention. As illustrated in FIG. 4, semiconductor component 100 further comprises a region 410 and a region 420. Regions 410 and 420 are formed from at least a portion of semiconductor layer 124, in a manner that will be further discussed below.

FIG. 5 is a cross-sectional view of semiconductor component 100 at a later point in the manufacturing process according to an embodiment of the invention. As illustrated in FIG. 5, semiconductor component 100 further comprises a metal layer 501. Metal layer 501 comprises metal regions 510 and a metal region 520. The purpose for and fabrication of metal layer 501, including metal regions 510 and 520, will be further explained below. In one embodiment, metal layer 501 comprises titanium, platinum, and gold. In a particular embodiment, metal layer 501 comprises a four-layer stack of, from bottom to top, platinum, titanium, platinum, and gold.

FIG. 6 is a cross-sectional view of semiconductor component 100 at a later point in the manufacturing process according to an embodiment of the invention. As illustrated in FIG. 6, semiconductor component 100 further comprises a metal region 610. The purpose for and fabrication of metal region 610 will be further explained below. In one embodiment, metal region 610 is an alloy of nickel, germanium, and gold. Semiconductor component 100 still further comprises a region 620 and a region 630. Regions 620 and 630 are formed from at least a portion of semiconductor layer 124.

FIG. 7 is a cross-sectional view of semiconductor component 100 at a later point in the manufacturing process according to an embodiment of the invention. As illustrated in FIG. 7, semiconductor component 100 further comprises a gap 710. The purpose for and fabrication of gap 710 will be further explained below. Semiconductor component 100 still further comprises a region 720, a region 730, a bipolar transistor 770 in region 720 and a field effect transistor 780 in region 730. Bipolar transistor 770 and field effect transistor 780 are formed in epitaxial semiconductor layer 120. In one embodiment, bipolar transistor 770 is a heterojunction bipolar transistor (HBT). In the same or a different embodiment, field effect transistor 780 is a junction field effect transistor (JFET).

Semiconductor layer 121 forms a sub-collector layer of bipolar transistor 770, and semiconductor layer 122 forms a collector layer of bipolar transistor 770. Semiconductor layer 123 forms a base of bipolar transistor 770 and a gate of field effect transistor 780. In one embodiment, at least the portion of semiconductor layer 123 used to form the base of bipolar transistor 770 has substantially the same doping concentration in the horizontal direction as the portion of semiconductor layer 123 used to form the gate of field effect transistor 780. In this context, "substantially the same doping concentration" means there is no intentional variation of the doping concentration in the horizontal direction within the limits of the epitaxial growth procedure.

Semiconductor layer 124 forms an emitter of bipolar transistor 770 and a channel of field effect transistor 780. In one embodiment, at least the portion of semiconductor layer 124 used to form the emitter of bipolar transistor 770 has substantially the same doping concentration in the horizontal direction as the portion of semiconductor layer 124 used to form the channel of field effect transistor 780, which may be the same as or different than the aforementioned doping concentration of semiconductor layer 123. In this context, "substantially the same doping concentration" means there is no intentional variation of the doping concentration in the horizontal direction within the limits of the epitaxial growth procedure. Regions 410 and 420 are portions of an upper semiconductor layer of semiconductor layer 124, and regions 620 and 630 are portions of a lower semiconductor layer of semiconductor layer 124 below the upper semiconductor layer.

In one embodiment, portions of regions 620 and 410 in region 720 form an active area of bipolar transistor 770, and portions of regions 630 and 420 in region 730 form a channel of field effect transistor 780. The lower semiconductor layer and the upper semiconductor layer of semiconductor layer 124 form a heterojunction structure. Regions 620 and 630 have substantially similar doping concentrations, and regions 410 and 420 have substantially similar doping concentrations. In one embodiment, the upper semiconductor layer comprises aluminum gallium arsenide (AlGaAs) and the lower semiconductor layer comprises InGaP, or vice versa. In another embodiment, the upper semiconductor layer comprises GaAs; the lower semiconductor layer comprises InGaP; and the thickness of the lower semiconductor layer is greater than the thickness of the upper semiconductor layer. In yet another embodiment, all or a portion of the lower semiconductor layer is removed in the vicinity of metal regions 510 and 520.

Metal region 210 forms an emitter electrode of bipolar transistor 770. Metal regions 220 and 230 form source/drain electrodes of field effect transistor 780. Portions of semiconductor layer 125 form ohmic contact layers of bipolar transistor 770 and of field effect transistor 780. As an example, ohmic contact 310 can form an ohmic contact to the emitter electrode of bipolar transistor 770. As another example, ohmic contacts 320 and 330 can form ohmic contacts to the source/drain electrodes of field effect transistor 780. Metal regions 510 form a base electrode of bipolar transistor 770. Metal region 520 forms a gate electrode of field effect transistor 780. Metal region 610 forms a collector electrode of bipolar transistor 770.

Figure 8:
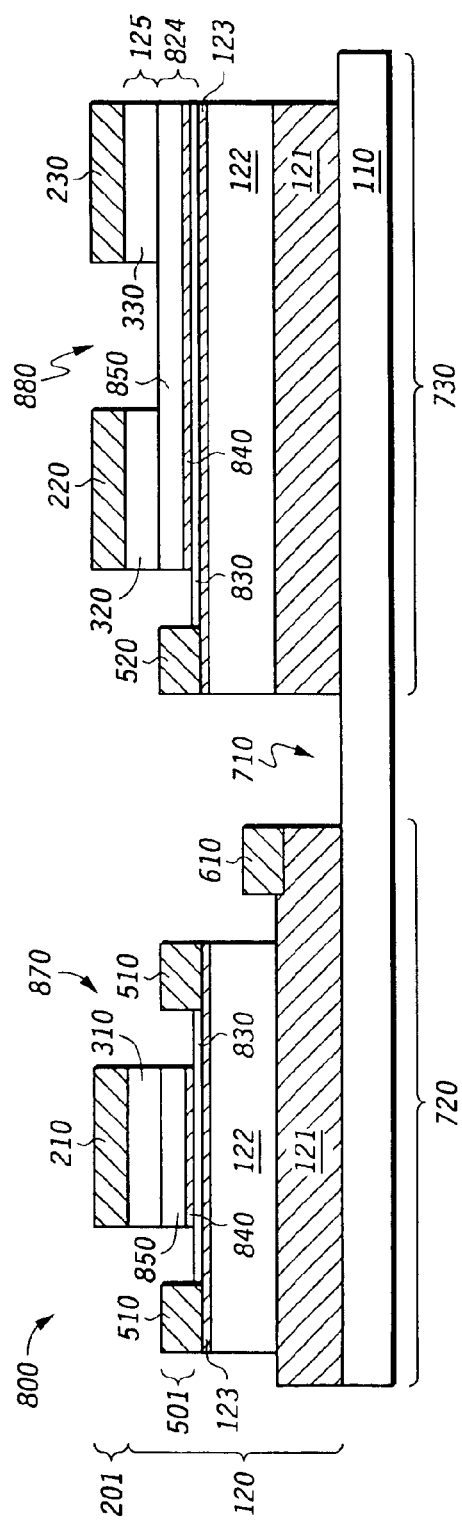
FIG. 8 is a cross-sectional view of a semiconductor component according to a different embodiment of the invention.

FIG. 8 is a cross-sectional view of a semiconductor component 800 according to an embodiment of the invention. Semiconductor component 800 is similar in many respects to semiconductor component 100, and elements of semiconductor component 800 that are also in semiconductor component 100 are indicated with the same reference numerals used in FIGS. 1–7 to describe elements of semiconductor component 100. As illustrated in FIG. 8, semiconductor component 800 comprises a semiconductor layer 824 between semiconductor layer 123 and semiconductor layer 125, all of which are still portions of epitaxial semiconductor layer 120. Semiconductor layer 824 comprises a lower semiconductor layer 830 adjacent to semiconductor layer 123, a middle semiconductor layer 840 above lower semiconductor layer 830, and an upper semiconductor layer 850 above middle semiconductor layer 840 and adjacent to semiconductor layer 125. Lower semiconductor layer 830, middle semiconductor layer 840, and upper semiconductor layer 850 form a heterojunction structure. In one embodiment, upper semiconductor layer 850 is at least as thick as the combined thicknesses of middle semiconductor layer 840 and lower semiconductor layer 830.

Semiconductor component 800 further comprises a bipolar transistor 870 in region 720 and a field effect transistor 880 in region 730. Bipolar transistor 870 and field effect transistor 880 are formed in epitaxial semiconductor layer 120. In one embodiment, bipolar transistor 870 is an HBT. In the same or a different embodiment, field effect transistor 880 is a JFET. Portions of lower semiconductor layer 830, middle semiconductor layer 840, and upper semiconductor layer 850 in region 720 form an active area of bipolar transistor 870. Portions of lower semiconductor layer 830, middle semiconductor layer 840, and upper semiconductor layer 850 in region 730 form a channel of field effect transistor 880. In one embodiment, the portion of lower semiconductor layer 830 forming the active area has a doping concentration that is substantially similar in the horizontal direction to the doping concentration of the portion of lower semiconductor layer 830 forming the channel. Similarly, the portion of middle semiconductor layer 840 forming the active area has a doping concentration in the horizontal direction that is substantially similar to, or the same as, the doping concentration of the portion of middle semiconductor layer 840 forming the channel, and the portion of upper semiconductor layer 850 forming the active area has a doping concentration in the horizontal direction that is substantially similar to, or the same as, the doping concentration of the portion of upper semiconductor layer 850 forming the channel.

In one embodiment, semiconductor layer 824 comprises GaAs, InGaP, and AlGaAs, where lower semiconductor layer 830 comprises InGaP or AlGaAs, middle semiconductor layer 840 is made up of a different material than the material that makes up lower semiconductor layer 830, and upper semiconductor layer 850 is made up of a different material than the material that makes up middle semiconductor layer 840. In a particular embodiment, lower semiconductor layer 830 and upper semiconductor layer 850 comprise InGaP; middle semiconductor layer 840 comprises GaAs; and the thickness of middle semiconductor layer 840 is less than the thickness of upper and lower semiconductor layers 850 and 830. In another particular embodiment, lower semiconductor layer 830 and upper semiconductor layer 850 comprise AlGaAs. In yet another particular embodiment, upper semiconductor layer 850 comprises InGaP and lower semiconductor layer 830 comprises AlGaAs, or vice versa.

Figure 9:
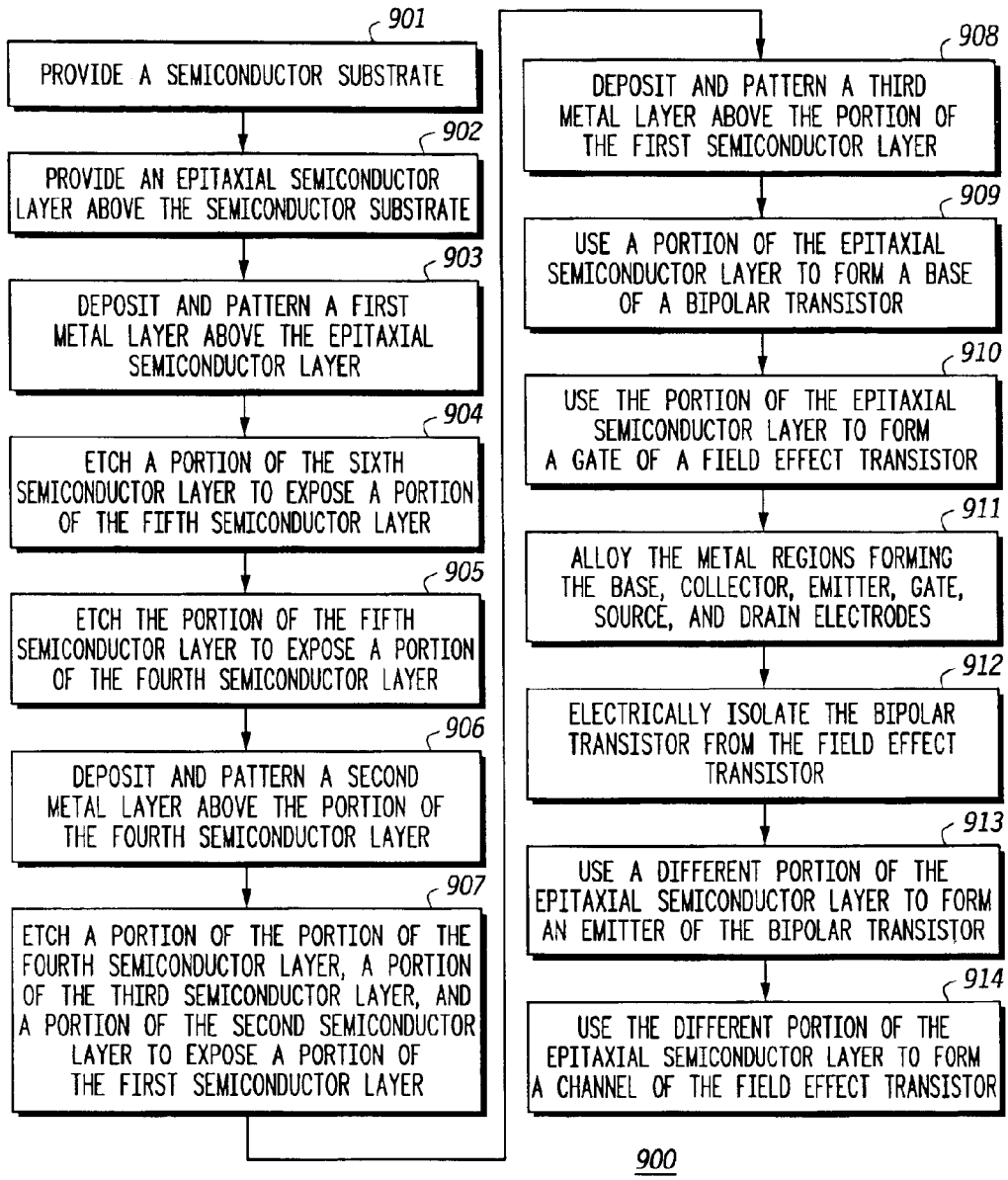
FIG. 9 is a flow chart illustrating a method of manufacturing a semiconductor component according to an embodiment of the invention.

FIG. 9 is a flow chart illustrating a method 900 of manufacturing a semiconductor component according to an embodiment of the invention. The semiconductor component comprises a plurality of layers. If the doping concentrations and thicknesses of certain ones of the plurality of layers are appropriately chosen, method 900 can require only a single mask in addition to the masks required in a standard bipolar transistor manufacturing process to integrate the field effect transistor into the semiconductor component. As an example, a channel of a field effect transistor can be chosen such that the field effect transistor has a pinch-off voltage greater than zero, with sufficiently low sub-threshold current at zero volts.

A step 901 of method 900 is to provide a semiconductor substrate. As an example, the semiconductor substrate can be similar to semiconductor substrate 110, first shown in FIG. 1.

A step 902 of method 900 is to provide an epitaxial semiconductor layer above the semiconductor substrate. As an example, the epitaxial semiconductor layer can be similar to epitaxial semiconductor layer 120, first shown in FIG. 1.

In one embodiment, step 902 comprises providing a first semiconductor layer, providing a second semiconductor layer over the first semiconductor layer, providing a third semiconductor layer over the second semiconductor layer, providing a fourth semiconductor layer over the third semiconductor layer, providing a fifth semiconductor layer over the fourth semiconductor layer, and providing a sixth semiconductor layer over the fifth semiconductor layer. As an example, the first, second, and third semiconductor layers can be similar to, respectively, semiconductor layer 121, semiconductor layer 122, and semiconductor layer 123, first shown in FIG. 1. As another example, the fourth semiconductor layer can be similar to regions 620 and 630, first shown in FIG. 6, or to semiconductor layer 830, first shown in FIG. 8, and the fifth semiconductor layer can be similar to regions 410 and 420, first shown in FIG. 4, or to semiconductor layers 840 and 850, first shown in FIG. 8. Accordingly, the fourth and fifth semiconductor layers together can be similar to semiconductor layer 124, first shown in FIG. 1. As still another example, the sixth semiconductor layer can be similar to semiconductor layer 125, first shown in FIG. 1.

Step 902 can further comprise forming each one of the first, second, third, fourth, fifth, and sixth semiconductor layers before patterning any of the first, second, third, fourth, fifth, and sixth semiconductor layers.

A step 903 of method 900 is to deposit and pattern a first metal layer above the epitaxial semiconductor layer. As an example, the first metal layer can be similar to metal layer 201, first shown in FIG. 2. The depositing and patterning processes used in step 903 and subsequent steps are well known in the art, and can include an etch process, a lift-off process, and the like. As an example, performing step 903 can form metal regions 210, 220, and 230, first shown in FIG. 2.

A step 904 of method 900 is to etch a portion of the sixth semiconductor layer to expose a portion of the fifth semiconductor layer. As an example, performing step 904 can form ohmic contacts 310, 320, and 330, first shown in FIG. 3. In one embodiment, step 904 comprises selectively etching a portion of the sixth semiconductor layer. In this embodiment, the properties of the fifth and sixth semiconductor layers are sufficiently different that an etch process can selectively remove the portion of the sixth semiconductor layer without significantly affecting the fifth semiconductor layer. Accordingly, the thickness and doping concentration of the fifth semiconductor layer can be chosen to provide desired electrical properties for the semiconductor component or portion thereof. In the same or another embodiment, steps 905 and/or 907, described below, or another etch step can also comprise a selective etch.

A step 905 of method 900 is to etch the portion of the fifth semiconductor layer to expose a portion of the fourth semiconductor layer. As an example, performing step 905 can form regions 410 and 420, first shown in FIG. 4.

A step 906 of method 900 is to deposit and pattern a second metal layer above the portion of the fourth semiconductor layer. As an example, the second metal layer can be similar to metal layer 501, first shown in FIG. 5. As another example, performing step 906 forms metal regions 510 and 520, first shown in FIG. 5.

A step 907 of method 900 is to etch a portion of the portion of the fourth semiconductor layer, a portion of the third semiconductor layer, and a portion of the second semiconductor layer to expose a portion of the first semiconductor layer. In one embodiment, step 907 can be performed before step 906. In this embodiment, step 906 is modified in that step 906 deposits and patterns the second metal layer above the third semiconductor layer rather than above the portion of the fourth semiconductor layer.

A step 908 of method 900 is to deposit and pattern a third metal layer above the portion of the first semiconductor layer. As an example, performing step 908 forms metal region 610, first shown in FIG. 6.

A step 909 of method 900 is to use a portion of the epitaxial semiconductor layer to form a base of a bipolar transistor. As an example, the portion of the epitaxial semiconductor layer can be similar to semiconductor layer 123, first shown in FIG. 1. As another example, the bipolar transistor can be similar to bipolar transistor 770 in FIG. 7. As still another example, the bipolar transistor can be similar to bipolar transistor 870 in FIG. 8.

A step 910 of method 900 is to use the portion of the epitaxial semiconductor layer to form a gate of a field effect transistor. As an example, the field effect transistor can be similar to field effect transistor 780 in FIG. 7. As another example, the field effect transistor can be similar to field effect transistor 880 in FIG. 8.

A step 911 of method 900 is to alloy the aforementioned metal regions, which form the base, collector, emitter, gate, source, and drain electrodes.

A step 912 of method 900 is to electrically isolate the bipolar transistor from the field effect transistor. As an example, step 912 can be accomplished by etching away a portion of the portion of the first semiconductor layer, and, in at least one embodiment, also etching away a portion of the semiconductor substrate. Performing step 912 in this fashion forms gap 710, first shown in FIG. 7. As another example, step 912 can be accomplished by implanting a dopant having a conductivity type opposite the conductivity type of the first semiconductor layer or the semiconductor substrate, or by implanting a non-dopant, such as oxygen, argon, or the like. As still another example, step 912 can be accomplished by performing both the etch step and one or both implant steps described above. In one embodiment, step 912 can be performed before steps 909, 910, and 911.

A step 913 of method 900 is to use a different portion of the epitaxial semiconductor layer to form an emitter of the bipolar transistor. As an example, the different portion of the epitaxial semiconductor layer can comprise the fourth semiconductor layer and the fifth semiconductor layer, and can be similar to semiconductor layer 124, first shown in FIG. 1, or to semiconductor layer 824, first shown in FIG. 8.

A step 914 of method 900 is to use the different portion of the epitaxial semiconductor layer to form a channel of the field effect transistor.

Semiconductor component 100 and semiconductor component 800 are two embodiments of a field effect transistor that has been integrated into a bipolar transistor platform according to embodiments of the invention. As explained above, for certain applications it is desirable to integrate a JFET into a GaAs HBT technology. One such application is a bias circuit in an HBT power amplifier, such as is commonly used in mobile telephones. One embodiment of such a bias circuit is shown in FIG. 10.

The most commonly used bias circuits require two transistors in series. The voltage drop associated with using two GaAs HBT emitter-base junctions in series is too large to be practical with the low reference voltage available in mobile telephones. Existing products address the excessive voltage drop issue by using a low-control-voltage transistor from a different process technology. However, this approach requires an additional die, increasing both the size and the cost of the power amplifier module. Furthermore, this approach increases the size of each GaAs die, because the additional bond pads needed to interface with the off-chip bias circuit are larger than the bias circuit itself. Accordingly, the cost, size, and complexity of the bias circuit, the HBT power amplifier, and the mobile telephone are all reduced by monolithically integrating the low-control-voltage transistor, such as field effect transistor 780 or field effect transistor 880, into the GaAs die, as taught herein.

Figure 10:
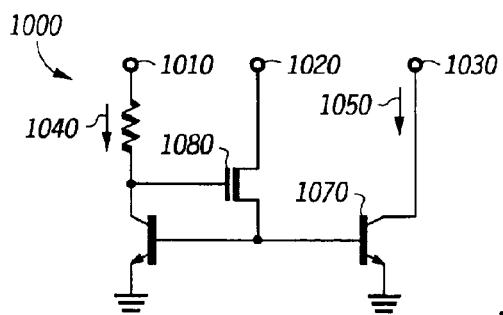
FIG. 10 is a diagram illustrating a circuit comprising a semiconductor component according to an embodiment of the invention.

FIG. 10 is a diagram illustrating a bias circuit 1000 comprising a semiconductor component according to an embodiment of the invention. In one embodiment, bias circuit 1000 is a power amplifier bias circuit such as is commonly used in mobile telephones. Bias circuit 1000 comprises a bipolar transistor 1070 and a field effect transistor 1080. As an example, bipolar transistor 1070 can be similar to bipolar transistor 770 in FIG. 7 or to bipolar transistor 870 in FIG. 8, and field effect transistor 1080 can be similar to field effect transistor 780 in FIG. 7 or to field effect transistor 880 in FIG. 8. Bias circuit 1000 further comprises a reference voltage pin 1010, and a supply voltage pin 1020, a supply voltage pin 1030. An arrow 1040 indicates a direction of a bias current. An arrow 1050 indicates a direction of a current equal to the bias current multiplied by a scale factor.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor component comprising:
    a semiconductor substrate;
    an epitaxial semiconductor layer above the semiconductor substrate;
    a bipolar transistor in the epitaxial semiconductor layer; and
    a field effect transistor in the epitaxial semiconductor layer,
    wherein:
        a turn-on voltage of the field effect transistor is less than an emitter-base turn-on voltage of the bipolar transistor;
        a pinch-off voltage of the field effect transistor is greater than zero;
        the semiconductor substrate has a surface;
        a direction substantially parallel to the surface of the semiconductor substrate is a horizontal direction;
        a first portion of the epitaxial semiconductor layer forms a base of the bipolar transistor and a non-metal gate of the field effect transistor;
        the non-metal gate is the only gate of the field effect transistor; and
        the first portion of the epitaxial semiconductor layer has a substantially uniform doping concentration in the horizontal direction.

2. The semiconductor component of claim 1 wherein:
    a second portion of the epitaxial semiconductor layer forms an emitter of the bipolar transistor and a channel of the field effect transistor; and
    the second portion of the epitaxial semiconductor layer has a substantially uniform doping concentration in the horizontal direction.

3. The semiconductor component of claim 1 wherein:
    the bipolar transistor is a heterojunction bipolar transistor; and
    the field effect transistor is a junction field effect transistor.

4. The semiconductor component of claim 1 wherein:
    the bipolar transistor and the field effect transistor are portions of a power amplifier bias circuit.

5. The semiconductor component of claim 1 wherein:
    the epitaxial semiconductor layer comprises a first semiconductor layer, a second semiconductor layer over the first semiconductor layer, a third semiconductor layer over the second semiconductor layer, a fourth semiconductor layer over the third semiconductor layer, and a fifth semiconductor layer over the fourth semiconductor layer; and
    the third semiconductor layer forms the first portion of the epitaxial semiconductor layer.

6. The semiconductor component of claim 5 wherein:
    the first semiconductor layer forms a sub-collector layer of the bipolar transistor;
    the second semiconductor layer forms a collector layer of the bipolar transistor; and
    a portion of the fifth semiconductor layer forms an ohmic contact layer of the bipolar transistor and of the field effect transistor.

7. The semiconductor component of claim 5 wherein:
    the third semiconductor layer has a doping concentration greater than or equal to $5 \times 10^{18}$ atoms per cubic centimeter; and
    the third semiconductor layer has a thickness between approximately 30 and 150 nanometers.

8. A semiconductor component comprising:
    a semiconductor substrate;
    an epitaxial semiconductor layer above the semiconductor substrate;
    a bipolar transistor in the epitaxial semiconductor layer; and
    a field effect transistor in the epitaxial semiconductor layer,
    wherein:
        the semiconductor substrate has a surface;
        a direction substantially parallel to the surface of the semiconductor substrate is a horizontal direction;
        a first portion of the epitaxial semiconductor layer forms a base of the bipolar transistor and a gate of the field effect transistor;
        the first portion of the epitaxial semiconductor layer has a substantially uniform doping concentration in the horizontal direction;
        the epitaxial semiconductor layer comprises a first semiconductor layer, a second semiconductor layer over the first semiconductor layer, a third semiconductor layer over the second semiconductor layer, a fourth semiconductor layer over the third semiconductor layer, and a fifth semiconductor layer over the fourth semiconductor layer;

the third semiconductor layer forms the first portion of the epitaxial semiconductor layer;

the fourth semiconductor layer comprises:
a lower semiconductor layer adjacent to the third semiconductor layer;
an upper semiconductor layer adjacent to the fifth semiconductor layer; and
a middle semiconductor layer between the lower semiconductor layer and the upper semiconductor layer; and portions of the lower semiconductor layer, the middle semiconductor layer, and the upper semiconductor layer form an active area of the bipolar transistor.

9. The semiconductor component of claim 8 wherein:
the portions of the lower semiconductor layer, the middle semiconductor layer, and the upper semiconductor layer form a channel of the field effect transistor.

10. The semiconductor component of claim 8 wherein:
the fourth semiconductor layer has a doping concentration between approximately $5 \times 10^{16}$ and $5 \times 10^{18}$ atoms per cubic centimeter; and
the fourth semiconductor layer has a thickness between approximately 30 and 300 nanometers.

11. A semiconductor component comprising:
a semiconductor substrate;
an epitaxial semiconductor layer above the semiconductor substrate;
a heterojunction bipolar transistor formed at least partially within the epitaxial semiconductor layer; and
a junction field effect transistor formed at least partially within the epitaxial semiconductor layer;
wherein:
a turn-on voltage of the field effect transistor is less than an emitter-base turn-on voltage of the bipolar transistor;
a pinch-off voltage of the field effect transistor is greater than zero;
the epitaxial semiconductor layer comprises:
a first semiconductor layer above the semiconductor substrate; and
a second semiconductor layer above the first semiconductor layer;
the semiconductor substrate has a surface;
a direction substantially parallel to the surface of the semiconductor substrate is a horizontal direction;
a portion of the first semiconductor layer forms a base of the heterojunction bipolar transistor and a non-metal gate of the junction field effect transistor;
the non-metal gate is the only gate of the field effect transistor;
a portion of the second semiconductor layer forms an emitter of the heterojunction bipolar transistor and a channel of the junction field effect transistor;
the portion of the first semiconductor layer has a substantially uniform doping concentration in the horizontal direction; and
the portion of the second semiconductor layer has a substantially uniform doping concentration in the horizontal direction.

12. The semiconductor component of claim 11 wherein:
the epitaxial semiconductor layer further comprises:
a third semiconductor layer below the first semiconductor layer;
a fourth semiconductor layer between the third semiconductor layer and the first semiconductor layer; and
a fifth semiconductor layer above the second semiconductor layer;
the third semiconductor layer forms a sub-collector layer of the heterojunction bipolar transistor;
the fourth semiconductor layer forms a collector layer of the heterojunction bipolar transistor; and
a portion of the fifth semiconductor layer forms an ohmic contact layer of the heterojunction bipolar transistor and of the junction field effect transistor.

13. The semiconductor component of claim 11 wherein:
the heterojunction bipolar transistor and the junction field effect transistor are portions of a power amplifier bias circuit.

14. A semiconductor component comprising:
a semiconductor substrate;
an epitaxial semiconductor layer above the semiconductor substrate;
a heterojunction bipolar transistor formed at least partially within the epitaxial semiconductor layer; and
a junction field effect transistor formed at least partially within the epitaxial semiconductor layer;
wherein:
the epitaxial semiconductor layer comprises:
a first semiconductor layer above the semiconductor substrate; and
a second semiconductor layer above the first semiconductor layer;
the semiconductor substrate has a surface;
a direction substantially parallel to the surface of the semiconductor substrate is a horizontal direction;
a portion of the first semiconductor layer forms a base of the heterojunction bipolar transistor and a gate of the junction field effect transistor;
a portion of the second semiconductor layer forms an emitter of the heterojunction bipolar transistor and a channel of the junction field effect transistor;
the portion of the first semiconductor layer has a substantially uniform doping concentration in the horizontal direction;
the portion of the second semiconductor layer has a substantially uniform doping concentration in the horizontal direction;
the second semiconductor layer comprises:
a lower semiconductor layer adjacent to the first semiconductor layer;
an upper semiconductor layer above the lower semiconductor layer; and
a middle semiconductor layer between the lower semiconductor layer and the upper semiconductor layer;
portions of the lower semiconductor layer, the middle semiconductor layer, and the upper semiconductor layer form an active area of the emitter; and
the lower semiconductor layer, the middle semiconductor layer, and the upper semiconductor layer form a heterojunction structure.

15. The semiconductor component of claim 14 wherein:
the portion of the second semiconductor layer has a doping concentration between approximately $1 \times 10^{17}$ and $1 \times 10^{18}$ atoms per cubic centimeter; and
the portion of the second semiconductor layer has a thickness between approximately 30 and 300 nanometers.

16. The semiconductor component of claim 14 wherein:
the portion of the first semiconductor layer has a doping concentration between approximately $4 \times 10^{19}$ and $5 \times 10^{19}$ atoms per cubic centimeter; and
the portion of the first semiconductor layer has a thickness between approximately 60 and 100 nanometers.

17. The semiconductor component of claim 14 wherein:
the portions of the lower semiconductor layer, the middle semiconductor layer, and the upper semiconductor layer form the channel of the junction field effect transistor.

18. The semiconductor component of claim 17 wherein:
the portions of the lower semiconductor layer forming the active area have a doping concentration that is substantially similar in the horizontal direction to the doping concentration of the portions of the lower semiconductor layer forming the channel;
the portions of the middle semiconductor layer forming the active area have a doping concentration that is substantially similar in the horizontal direction to the doping concentration of the portions of the middle semiconductor layer forming the channel; and
the portions of the upper semiconductor layer forming the active area have a doping concentration that is substantially similar in the horizontal direction to the doping concentration of the portions of the upper semiconductor layer forming the channel.

19. A method of manufacturing a semiconductor component, the method comprising:
providing a semiconductor substrate;
providing an epitaxial semiconductor layer above the semiconductor substrate;
using a first portion of the epitaxial semiconductor layer to form a base of a bipolar transistor; and
using the first portion of the epitaxial semiconductor layer to form a gate of a field effect transistor,
wherein:
the first portion of the epitaxial semiconductor layer has a substantially uniform doping concentration in the horizontal direction;
a turn-on voltage of the field effect transistor is less than an emitter-base turn-on voltage of the bipolar transistor;
a pinch-off voltage of the field effect transistor is greater than zero;
a first portion of the epitaxial semiconductor layer forms a base of the bipolar transistor and a non-metal gate of the field effect transistor; and
the non-metal gate is the only gate of the field effect transistor.

20. The method of claim 19 further comprising:
using a second portion of the epitaxial semiconductor layer to form an emitter of the bipolar transistor; and
using the second portion of the epitaxial semiconductor layer to form a channel of the field effect transistor.

21. The method of claim 19 wherein:
forming the bipolar transistor comprises forming a heterojunction bipolar transistor; and
forming the field effect transistor comprises forming a junction field effect transistor.

22. The method of claim 19 wherein:
providing the epitaxial semiconductor layer comprises:
providing a first semiconductor layer;
providing a second semiconductor layer over the first semiconductor layer;
providing a third semiconductor layer over the second semiconductor layer;
providing a fourth semiconductor layer over the third semiconductor layer;
providing a fifth semiconductor layer over the fourth semiconductor layer; and
providing a sixth semiconductor layer over the fifth semiconductor layer.

23. The method of claim 22 wherein:
providing the epitaxial semiconductor layer further comprises:
forming each one of the first, second, third, fourth, fifth, and sixth semiconductor layers before patterning any of the first, second, third, fourth, fifth, and sixth semiconductor layers.

24. The method of claim 22 wherein:
using the first portion of the epitaxial semiconductor layer to form the base further comprises:
using the third semiconductor layer to form the base; and
using the first portion of the epitaxial semiconductor layer to form the gate further comprises:
using the third semiconductor layer to form the gate.

25. The method of claim 22 further comprising:
using the sixth semiconductor layer to form an ohmic contact region of the bipolar transistor and of the field effect transistor.

26. The method of claim 22 wherein:
providing the third semiconductor layer comprises:
providing the third semiconductor layer to have a doping concentration equal to at least $5 \times 10^{18}$ atoms per cubic centimeter; and
providing the third semiconductor layer to have a thickness between approximately 30 and 150 nanometers.

27. A method of manufacturing a semiconductor component, the method comprising:
providing a semiconductor substrate;
providing an epitaxial semiconductor layer above the semiconductor substrate;
using a first portion of the epitaxial semiconductor layer to form a base of a bipolar transistor; and
using the first portion of the epitaxial semiconductor layer to form a gate of a field effect transistor,
wherein:
the first portion of the epitaxial semiconductor layer has a substantially uniform doping concentration in the horizontal direction;
providing the epitaxial semiconductor layer comprises:
providing a first semiconductor layer;
providing a second semiconductor layer over the first semiconductor layer;
providing a third semiconductor layer over the second-semiconductor layer;
providing a fourth semiconductor layer over the third semiconductor layer;
providing a fifth semiconductor layer over the fourth semiconductor layer;
providing a sixth semiconductor layer over the fifth semiconductor layer; and
the method further comprises:
using the fourth semiconductor layer and the fifth semiconductor layer to form an emitter of the bipolar transistor; and
using the fourth semiconductor layer and the fifth semiconductor layer to form a channel of the field effect transistor.

28. The method of claim 27 further comprising:
using the first semiconductor layer to form a sub-collector layer of the bipolar transistor; and
using the second semiconductor layer to form a collector layer of the bipolar transistor.

29. The method of claim 27 wherein:
providing the fifth semiconductor layer comprises:
  providing an upper semiconductor layer adjacent to the sixth semiconductor layer; and
  providing a middle semiconductor layer between the upper semiconductor layer and the fourth semiconductor layer; and
providing the fourth semiconductor layer and the fifth semiconductor layer further comprises:
  using the fourth semiconductor layer, the middle semiconductor layer, and the upper semiconductor layer to form an active area of an emitter of the bipolar transistor; and
  using the fourth semiconductor layer, the middle semiconductor layer, and the upper semiconductor layer to form a channel of the field effect transistor.

30. The method of claim 27 wherein:
providing the fourth and fifth semiconductor layers comprises:
  providing the fourth and fifth semiconductor layers to have a doping concentration between approximately $5 \times 10^{16}$ and $5 \times 10^{18}$ atoms per cubic centimeter; and
  providing the fourth and fifth semiconductor layers to have a combined thickness between approximately 30 and 300 nanometers.

31. The method of claim 27 further comprising:
depositing and patterning a first metal layer above the epitaxial semiconductor layer;
etching a portion of the sixth semiconductor layer to expose a portion of the fifth semiconductor layer;
etching the portion of the fifth semiconductor layer to expose a portion of the fourth semiconductor layer;
depositing and patterning a second metal layer above the portion of the fourth semiconductor layer;
etching a portion of the portion of the fourth semiconductor layer, a portion of the third semiconductor layer, and a portion of the second semiconductor layer to expose a portion of the first semiconductor layer; and
depositing and patterning a third metal layer above the portion of the first semiconductor layer.

32. The method of claim 31 wherein:
etching a portion of the sixth semiconductor layer to expose a portion of the fifth semiconductor layer comprises:
  selectively etching a portion of the sixth semiconductor layer.

33. The method of claim 31 further comprising:
electrically isolating the bipolar transistor from the field effect transistor.

34. The method of claim 31 wherein:
depositing and patterning the second metal layer above the portion of the fourth semiconductor layer comprises:
  forming a base electrode of the bipolar transistor and a gate electrode of the field effect transistor; and
depositing and patterning the third metal layer above the portion of the first semiconductor layer comprises:
  forming a collector electrode of the bipolar transistor.

35. The method of claim 34 further comprising:
alloying the base electrode, the gate electrode, and the collector electrode.

36. A semiconductor component comprising:
a semiconductor substrate;
an epitaxial semiconductor layer above the semiconductor substrate;
a bipolar transistor in the epitaxial semiconductor layer; and
a field effect transistor in the epitaxial semiconductor layer,
wherein:
  a first portion of the epitaxial semiconductor layer forms a base of the bipolar transistor and a non-metal gate of the field effect transistor;
  the non-metal gate is the only gate of the field effect transistor; and
  the field effect transistor is capable of operating in enhancement mode.

37. The semiconductor component of claim 36 wherein:
a second portion of the epitaxial semiconductor layer forms an emitter of the bipolar transistor and a channel of the field effect transistor;
the epitaxial semiconductor layer comprises a first semiconductor layer, a second semiconductor layer over the first semiconductor layer, a third semiconductor layer over the second semiconductor layer, a fourth semiconductor layer over the third semiconductor layer, and a fifth semiconductor layer over the fourth semiconductor layer;
the third semiconductor layer forms the first portion of the epitaxial semiconductor layer; and
the channel is formed only from portions of the fourth semiconductor layer.

38. A semiconductor component comprising:
a semiconductor substrate;
an epitaxial semiconductor layer above the semiconductor substrate;
a bipolar transistor in the epitaxial semiconductor layer; and
a field effect transistor in the epitaxial semiconductor layer,
wherein:
  a first portion of the epitaxial semiconductor layer forms a base of the bipolar transistor and a non-metal gate of the field effect transistor;
  the non-metal gate is the only gate of the field effect transistor;
  a turn-on voltage of the field effect transistor is less than an emitter-base turn-on voltage of the bipolar transistor;
  the bipolar transistor comprises a collector and a base;
  the non-metal gate is electrically coupled to the collector;
  the field effect transistor comprises a source contact and a drain contact;
  a second bipolar transistor comprises a second base; and
  either the source contact or the drain contact is electrically coupled to: (1) the base of the bipolar transistor; and (2) the second base of the second bipolar transistor.

* * * * *